(12) United States Patent
Aronoff

(10) Patent No.: US 12,203,973 B2
(45) Date of Patent: *Jan. 21, 2025

(54) MONITORING SEMICONDUCTOR RELIABILITY AND PREDICTING DEVICE FAILURE DURING DEVICE LIFE

(71) Applicant: Alan Paul Aronoff, Pleasanton, CA (US)

(72) Inventor: Alan Paul Aronoff, Pleasanton, CA (US)

(73) Assignee: Tartan Silicon Systems, Inc., Pleasanton, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/125,537

(22) Filed: Mar. 23, 2023

(65) Prior Publication Data

US 2023/0280392 A1  Sep. 7, 2023

Related U.S. Application Data

(63) Continuation of application No. 17/339,993, filed on Jun. 5, 2021, now Pat. No. 11,650,244.

(Continued)

(51) Int. Cl.
*G01R 31/28* (2006.01)
*G01R 31/26* (2020.01)
(Continued)

(52) U.S. Cl.
CPC ..... *G01R 31/2642* (2013.01); *G01R 31/2817* (2013.01); *G01R 31/2856* (2013.01);
(Continued)

(58) Field of Classification Search
CPC ........... G01R 31/2642; G01R 31/2853; G01R 31/2856; G01R 31/2817; G01R 31/2858; G01R 31/2872; G01R 31/2881; G01R 31/2882; G01R 31/3187; G01R 31/31725; G01R 31/31937; G01R 31/2831; G01R 31/287; G01R 31/2879; G01R 31/2855; G01R 31/2851; G01R 31/318511; G01R 31/318505; G01R 31/002; G01R 31/275; G01R 31/2896; G01R 1/0491; G01R 31/2818; G01R 31/2648; G01R 31/52; G01R 31/318583; G01R 31/318513; G01R 31/3177; G01R 31/2843; G01R 31/54; G01R 1/067; G01R 31/2619; G01R 31/2628; G01R 31/2836; G01R 31/2812;

(Continued)

(56) References Cited

U.S. PATENT DOCUMENTS 6,807,503 B2 * 10/2004 Ye ..................... H01L 21/67276
                                                              438/18
7,835,890 B2 * 11/2010 Wu ....................... G06F 30/367
                                                              717/124

(Continued)

*Primary Examiner* — Vinh P Nguyen
(74) *Attorney, Agent, or Firm* — PatentPC; Bao Tran

(57) ABSTRACT

A circuit includes one or more sensors formed on one or more dies, each sensor detecting one or more wafer characterization data; a stress generator on the die to control the one or more sensors to place the one or more sensors under stress during wafer manufacturing or operation; and an interface coupled to the one or more sensors to communicate the wafer characterization data to a processor or a tester.

24 Claims, 8 Drawing Sheets

Related U.S. Application Data

(60) Provisional application No. 63/037,309, filed on Jun. 10, 2020.

(51) Int. Cl.
*G05B 13/02* (2006.01)
*G05B 19/4155* (2006.01)
*H01L 21/66* (2006.01)

(52) U.S. Cl.
CPC ....... *G05B 13/024* (2013.01); *G05B 19/4155* (2013.01); *H01L 22/34* (2013.01); *G05B 2219/45031* (2013.01)

(58) Field of Classification Search
CPC ........ G05B 2219/45031; G05B 13/024; G05B 19/4155; G05B 2219/31307; G05B 2219/32368; G05B 19/4184; G05B 19/41885; G05B 2219/2602; G05B 2219/31265; H01L 22/00; H01L 22/34; H01L 2924/0002; H01L 22/14; H01L 22/12; H01L 2924/14; H01L 21/67253; H01L 2225/06596; H01L 21/67276; H01L 2223/5446; H01L 24/03; H01L 2223/54433; H01L 21/67242; H01L 21/67248; G06F 13/385; G06F 30/367; G06F 30/36; G01B 2210/56

See application file for complete search history.

(56) References Cited

U.S. PATENT DOCUMENTS

| | | | | |
|---|---|---|---|---|
| 7,949,482 | B2* | 5/2011 | Gebara | G01R 31/31725 702/42 |
| 8,161,431 | B2* | 4/2012 | Buonpane | G06F 30/36 716/136 |
| 8,229,683 | B2* | 7/2012 | Gebara | G01R 31/31725 702/42 |
| 9,372,226 | B2* | 6/2016 | Uppal | G01R 31/2644 |
| 9,506,977 | B2* | 11/2016 | Burns | G01R 31/2856 |
| 10,429,434 | B2* | 10/2019 | Fifield | G01R 31/2879 |
| 10,564,214 | B2* | 2/2020 | Graas | G01R 31/2856 |
| 10,739,397 | B2* | 8/2020 | Briggs | G01R 31/2642 |
| 10,746,782 | B2* | 8/2020 | Briggs | G01R 31/2875 |
| 11,650,244 | B2* | 5/2023 | Aronoff | H01L 22/34 324/762.05 |
| 2006/0267621 | A1* | 11/2006 | Harris | G01R 31/2884 324/762.02 |

* cited by examiner

MONITORING SEMICONDUCTOR RELIABILITY AND PREDICTING DEVICE FAILURE DURING DEVICE LIFE

The present invention is related to application entitled "System for Optimizing Semiconductor Yield and enabling Product Traceability throughout Product Life", filed Jun. 5, 2021 with Ser. No. 17/339,992, and further claims priority to provisional application Ser. 63/037,309 filed Jun. 10, 2020, the contents of which are incorporated by reference.

BACKGROUND

The present invention is related to the field of semiconductor device design, designing for reliability, testing semiconductor devices, and the collection and analysis of the health of the device while the device is operating.

When it comes to semiconductor manufacturing, there are many different types of tests that need to be performed. These tests can range from parametric testing to complex functional analysis testing to detect certain defects in chips before they are released into the market. The more complex a test is, the more expensive the method should be as well. However, the more complex the test is, the more chances that the tests will help save the company money in the long run. There are several different methods for performing these tests, and several different levels of efficiency that can be achieved based on the particular test that a manufacturer is using.

For systems level tests, these typically require a series of non-contact conductance measurements to get a high level of accuracy in the measurement. These tests can then be compared to a design constraint in the semiconductor device. Automated test equipment (ATE) is used to test the wafers. Current state of the art ATE testers run a test program and output the measured the results into a database file. Generally, there are several file formats for the test result data base, but the most common are .stdf and .csv. The WAT (Wafer Acceptance Test) data is provided by the foundry for the sole purpose of confirming the wafer is built to the process specification parameters used by the foundry's customer in the design of the semiconductor product. The WAT data is typically provided in a .csv format which is readable by excel or another spread sheet. The process monitoring structures are provided either in a drop out die or in the scribe line between dies. FIG. 1 shows the wafer (10) and array of die (20) that are imprinted on the wafer. The dropouts for the process control monitors are shown in (30). The process data is sampled only at limited locations on the wafer. The process control monitor is measured prior to wafer shipment and the WAT data is provided. The process monitor structures for measuring the process parameters are destroyed during the chip assembly process and no longer available when the wafer is diced and the die are assembled into packaged parts. It is not possible to assign process parameter values of the WAT data to a specific die on the wafer. Also, it is neither possible to access nor measure the process control structures after the die has been assembled.

SUMMARY

In one aspect, a circuit includes one or more sensors formed on one or more dies, each sensor detecting one or more wafer characterization data; a stress generator on the die to control the one or more sensors to place the one or more sensors under stress during wafer manufacturing or operation; and an interface coupled to the one or more sensors to communicate the wafer characterization data to a processor or a tester.

In another aspect, a wafer includes one or more operating circuits on the wafer to perform predetermined operations after wafer fabrication and one or more stress test circuits operational only during wafer fabrication, each including circuit includes one or more sensors formed on one or more dies, each sensor detecting one or more wafer characterization data; a stress generator on the die to control the one or more sensors to place the one or more sensors under stress during wafer manufacturing or operation; and an interface coupled to the one or more sensors to communicate the wafer characterization data to a processor or a tester.

In a further aspect, an automated test equipment (ATE) is disclosed to test a wafer with one or more reliability sensors therein, each including a plurality of active and passive device structures that characterize a semiconductor manufacturing process, input/output (IO) pads adapted to be accessed by test hardware and control logic, memory, and control for programming the memory which identify the wafer and die location at test in an integrated circuit. The ATE includes probes electrically connected to the wafer to capture wafer functional data; and a database to store functional test measurements during or after fabricating the functional blocks, wherein the database predicts device failures based on information of known device failures or related process parameters and their relationship to functional test measurements.

In implementations, with the collected reliability data, machine learning code can be applied to provide traceability throughout a product life cycle including functional parameter measurements and related process parameters. Further, the system can include code for one or more of: measurement of the Reliability Sensors using the probes; integration of the measurement of the Reliability Sensors data with standard production test functional and parametric data into standard data base formats resulting in an Enterprise Database; reliability measurements captured during device operation into the Enterprise Database; integrating failed device reliability measurements into the Enterprise Database; and application of machine learning on the Enterprise Database to predict device failure.

Advantages of the system may include one or more of the following. The system enables detailed parametric testing of semiconductor devices by measuring the effects of modalities that will result in (1) a change in the device performance thereby leading to a failure, and (2) set of hard failures such as may occur to extreme overstress of the device. Effects that cause the device parameters to change include Negative Bias Temperature Instability (NBTI), Hot Carrier Injection (HCI), and Time Dependent Dielectric Breakdown (TDDB). Other advantages may include one or more of the following:

- The impact of the device parameters due to the failure modalities can be measured during production test and reported with other wafer and final test measurements.
- The impact of the device parameters due to the failure modalities can be measured during the operational life of the device, and this information can be reported by the device such that this information is included with the entire information data base for the product.
- The invention includes a mechanism whereby the reliability sensors can be stressed in similar fashion as the device itself is stressed.

The device will contain a unique identifier that can be read along with the measurements from the reliability monitors device performance and reliability can be tracked over the life of the device.

DETAILED DESCRIPTION

Figure 1:
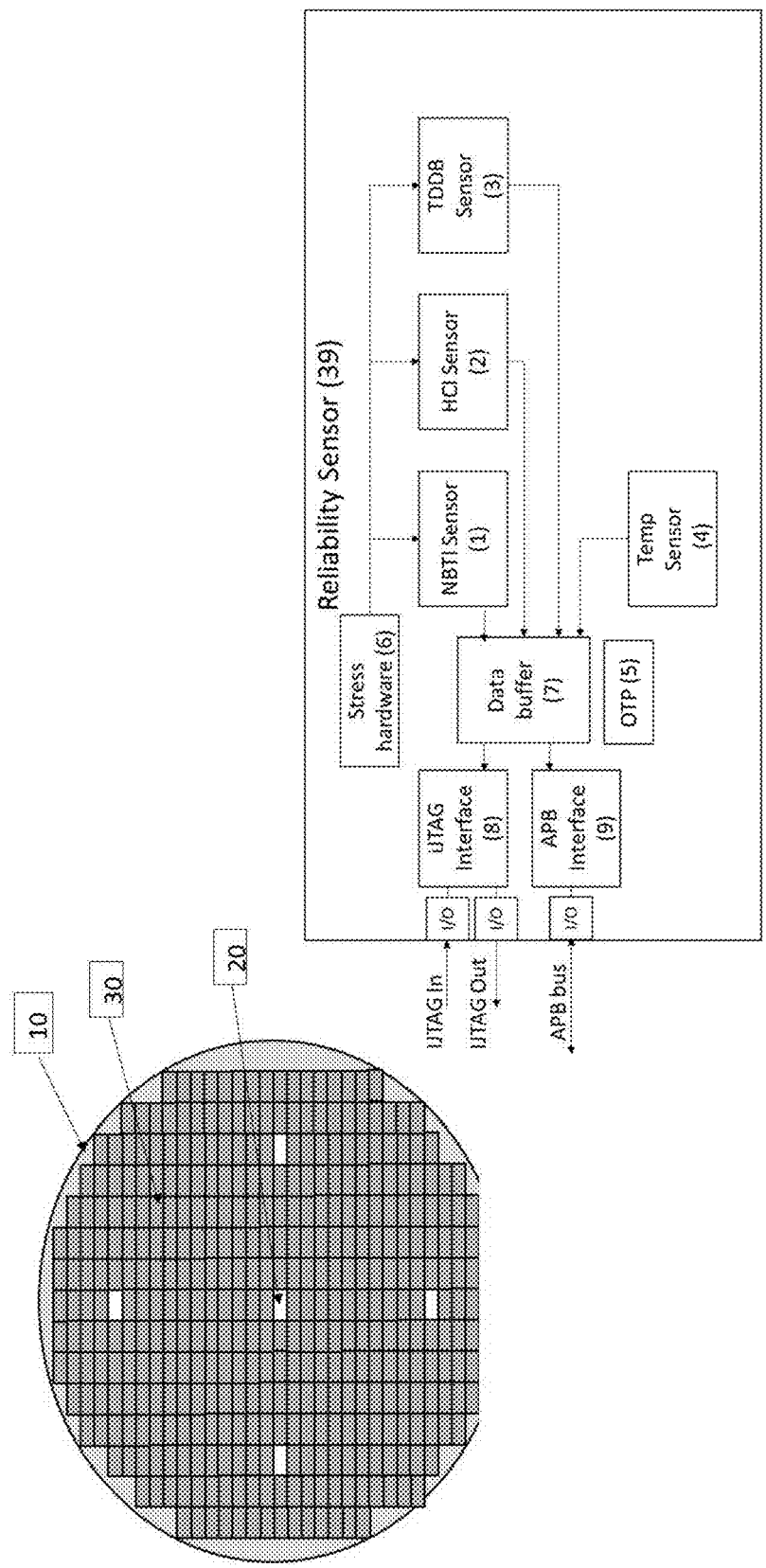
FIG. 1 shows an exemplary block diagram of a Reliability Sensor.

FIG. 1 shows an exemplary Reliability Sensor (39) fabricated on a die (30) on a wafer with one or more dropouts (20). The sensor consists of (1) a Negative Bias Temperature Instability (NBTI) sensor, (2) a Hot Carrier Injection (HCI) sensor, (3) TDDB sensor, (4) on-die temperature sensor, (5) a one-time programmable memory to store device ID information, (6) circuitry for stressing the reliability sensors, (7) data buffer for the collected sensor data, (8) an IJTAG bus interface so the measurement data can be read during ATE testing, and (9) a digital interface such as APB that permits the sensor information to be read during the device life cycle. Other sensors may include Positive Bias Temperature Instability (PBTI) sensors and sensors to detect electromigration, for example.

The Reliability Sensor is embedded in all die on a wafer and provides test and reliability data that that enable improving yield and reliability. The technology drivers for reducing feature size and targeting the semiconductor devices for mission critical applications such as enterprise computing, automotive, networking and military is requiring a new look at reliability issues. The sensor can capture data relating to semiconductor failure modalities that either cause a hard change in the circuit—such as electromigration or cause changes in device behavior that may result in circuit functionality no longer meeting specifications. Such failure modes include Negative Bias Temperature Instability, Hot Carrier Injection and Time Dependent Dielectric Breakdown. These failure modes are conventionally addressed at the design stage through following design and layout rules and providing guard banding for circuit performance, and now the Reliability Sensor of FIG. 1 provides accurate ongoing measurements of the mechanisms that impact reliability. The integrated sensors enable the measurement of the effects of these reliability modes and to integrates these measurements so they can be analyzed within the chip product life cycle database. This technology will enable chips that are designed for mission critical applications to be analyzed over the products useful life so that product failures can be predicted and thereby enable countermeasures to be taken at the system level prior to a system failure event.

In one aspect, data from the sensors can be used to create models for the IC design tools, and the foundries will build test chips in order that models can be developed that incorporate the effects of aging into the transistor behavior used for design. For example, data from the sensors is captured as the device ages. The aged transistor parameters can be incorporated into the EDA models that predict device operation due to aging, for example.

NBTI is a key reliability issue in MOSFETs, a type of transistor aging. NBTI manifests as an increase in the threshold voltage and consequent decrease in drain current and transconductance of a p channel MOSFET. Over time positive charges become trapped at the oxide-semiconductor boundary underneath the gate of an n-channel MOSFET. These positive charges partially cancel the negative gate voltage without contributing to conduction through the channel as electron holes in the semiconductor are supposed to. When the gate voltage is removed, the trapped charges dissipate over a time scale of milliseconds to hours. To monitor this effect, the NBTI sensor (1) consists of (1) a ring oscillator that is stressed under voltage, (2) a reference ring oscillator that is not stressed, and (3) a phase comparator as detailed in FIG. 2. NBTI is affected by a shift in threshold voltage with applied stress. When the shift exceeds some specified value, the device is considered to have failed. As transistors shrink, the distribution of voltage shifts under stress has broadened. Large transistors tend to have "average" behavior and can be seen as identical. In smaller devices, however, the time to failure due to NBTI varies widely: some devices fail quickly, others maintain their performance over the longest times that have been tested. Conversely, when the stress is removed, some devices recover very quickly, in fractions of a second, while others fail to recover over the longest intervals tested. While failure and recovery are both bias-dependent, the time constants of the two phenomena are not the same: some devices fail quickly and recover slowly. The system can apply stress and measure the distribution of voltage shifts simultaneously. The NBTI behavior can be assessed depending on the (often unknown) time interval between stress and measurement.

The parametric shifts or circuit failures caused by Hot Carrier Injection (HCI), Bias Temperature Instability (BTI), and Time Dependent Dielectric Breakdown (TDDB) have become more severe with shrinking device sizes and voltage margins. The HCI-stress impact on NMOSFETs has become a reliability concern in digital circuit design. It is the result of electron trapping or interface state generation induced by the ionization impact of channel carriers near the drain region and it causes the degradation of electrical parameters of a transistor when the transistor is switching. The wear out of the insulating properties of silicon dioxide in the CMOS gate results in the formation of a conducting path through the oxide to the substrate. Due to the presence of this conducting path, it is no longer possible to control the current between drain and source by controlling the gate voltage. With the technology scaling, the gate oxide thickness of CMOS devices decreases as well. Moreover, the saturating trend for supply voltage scaling results in a large electric field in the gate oxide, which forms tunneling currents. The lifetime of a particular gate oxide thickness is determined by the total amount of charge that flows through the gate oxide by tunneling current. Therefore, current generation technologies are more prone to oxide breakdown compared to older ones. Oxide breakdown can be categorized into HBD (hard breakdown) and SBD (soft breakdown). HBD is considered as a catastrophic failure of the device and hence the entire circuit. Compared to HBD, the conductance of SBD is limited. Even though SBD will not cause a catastrophic failure of the device, it will result in variation of circuit performance. To address these issues, the reliability sensor applies the stress circuit that paces the reliability sensors through a range of operational modes and the data is saved into memory for subsequent reliability analysis.

Figure 2:
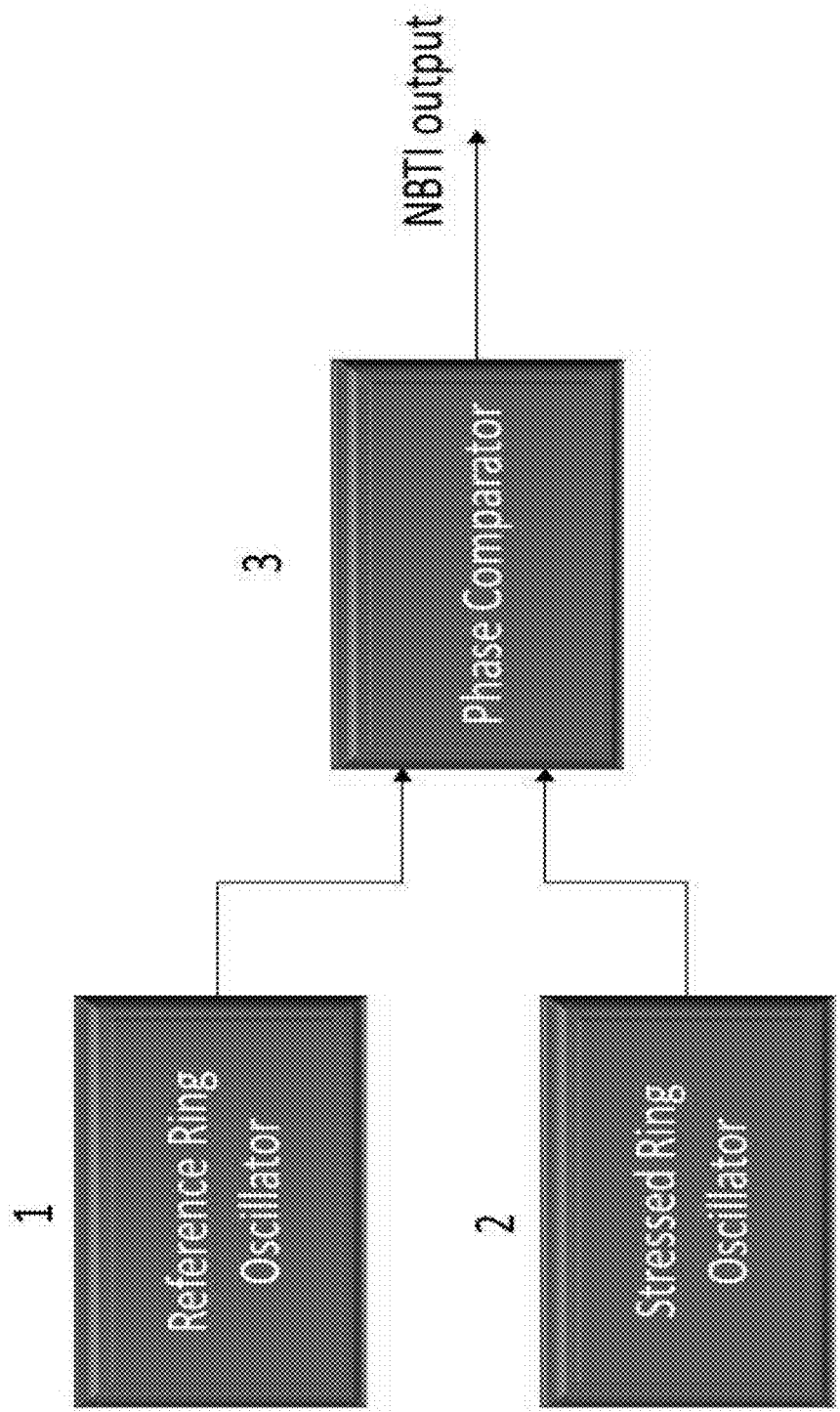
FIG. 2 shows an exemplary block diagram of an NBTI sensor.

In FIG. 2, the NBTI Sensor's stressed oscillator is stressed with a voltage on its supply lines. FIG. 2 shows the NBTI stress oscillator which is a series of inverters with various feedback loops from the output of each inverter in the chain. In addition, the stressed oscillator while in stress mode has the feedback loop in the oscillator disconnected and Stress signal causes the NAND gate to beak the oscillator loop, which is fed from a clock signal through the input to the NAND gate (a). In stress mode, the gates in the ring oscillator chain (b) are stressed with $VCC_{STRESS}$ applied to the substrate and source of the p-channel devices. In the stress mode, the switches (c) are open and switches (d) are closed there by allowing the $CLK_{STRESS}$ to apply time varying clock on the p channel gate which will drive stress the device when low and enable the device to recover when high.

Figure 3:
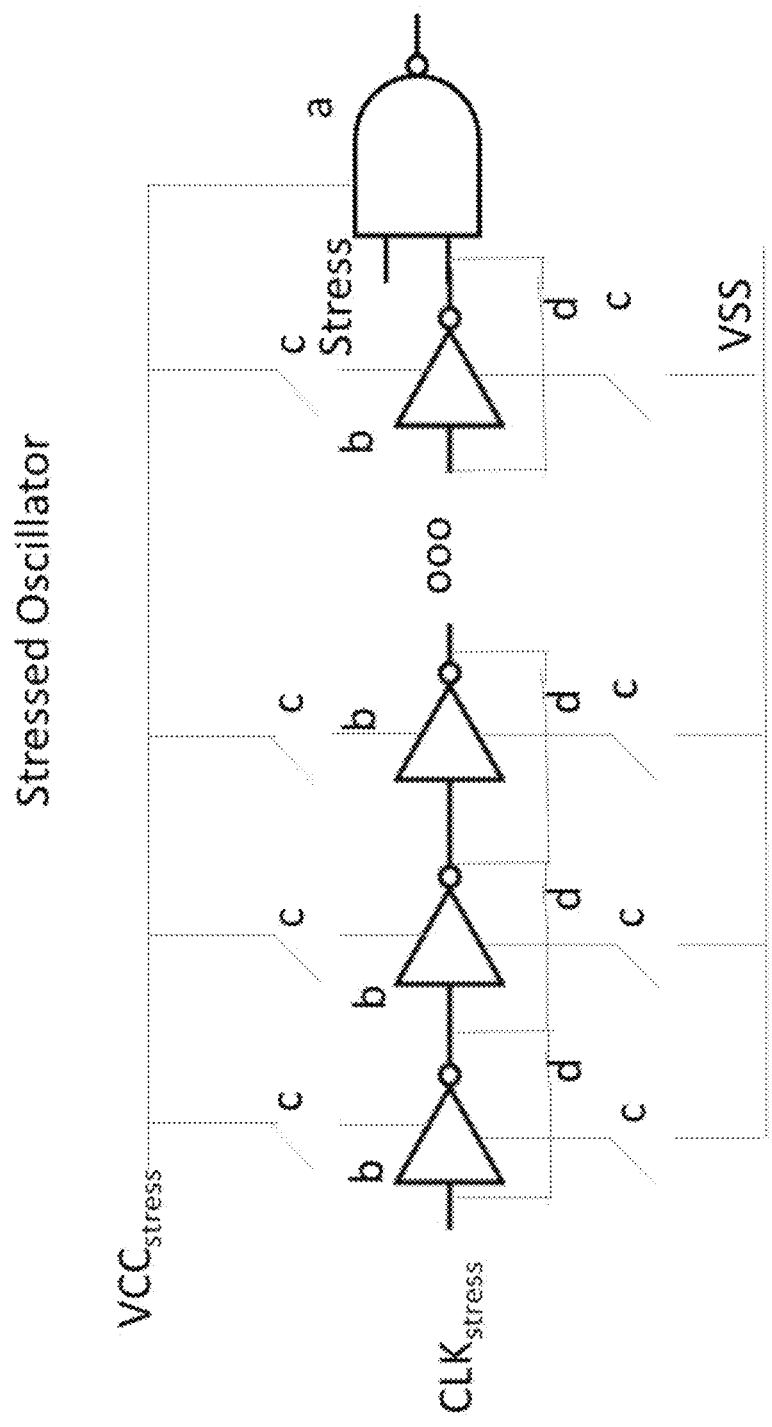
FIG. 3 shows an exemplary block diagram of an NBTI oscillator.

FIG. 3 shows an exemplary block diagram of an NBTI oscillator. FIG. 3 shows the stress oscillator when the device is stressed mode for aging the devices for the NBTI. The $VCC_{STRESS}$ and stress clock are generated by the Stress Generator Hardware block (6) and this block includes supplying power for the sensors as well. When the sensors are measured, switches (c) are closed and switches (d) are opened.

Figure 4:
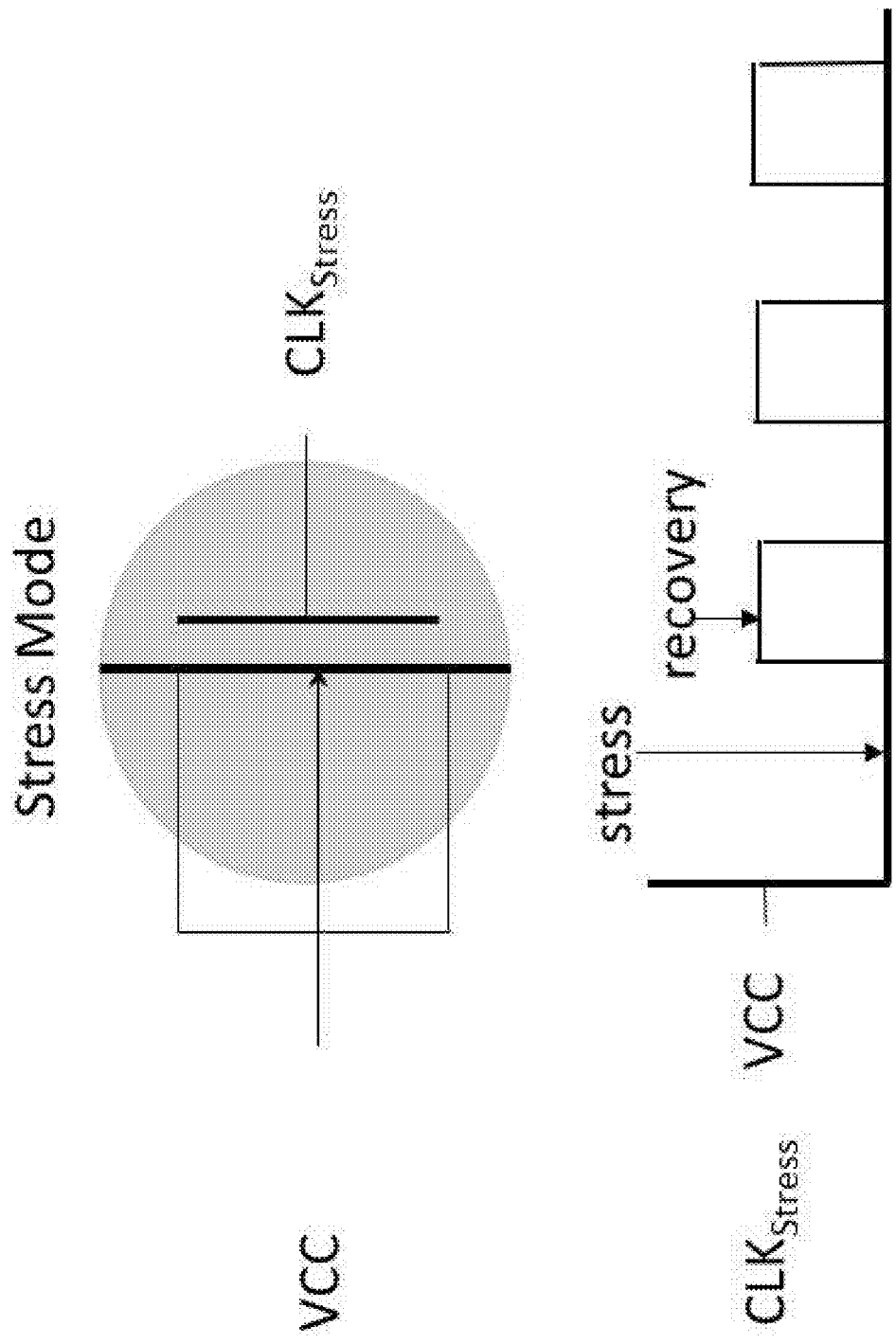
FIG. 4 shows an exemplary operation of an NBTI stressed p-channel device.

In the measurement mode, the stressed oscillator and the reference oscillator are running. The phase comparator (3) measures the frequency difference between the reference oscillator and the stressed oscillator. FIG. 4 below shows the voltages and signals applied to the p-channel devices when in stress mode.

FIG. 4 shows an exemplary operation of an NBTI stressed p-channel device. A stress clock is applied to turn on the stress circuit during a stress mode. After a predetermined stress period, a series of recovery time is provided using the clock.

Figure 5:
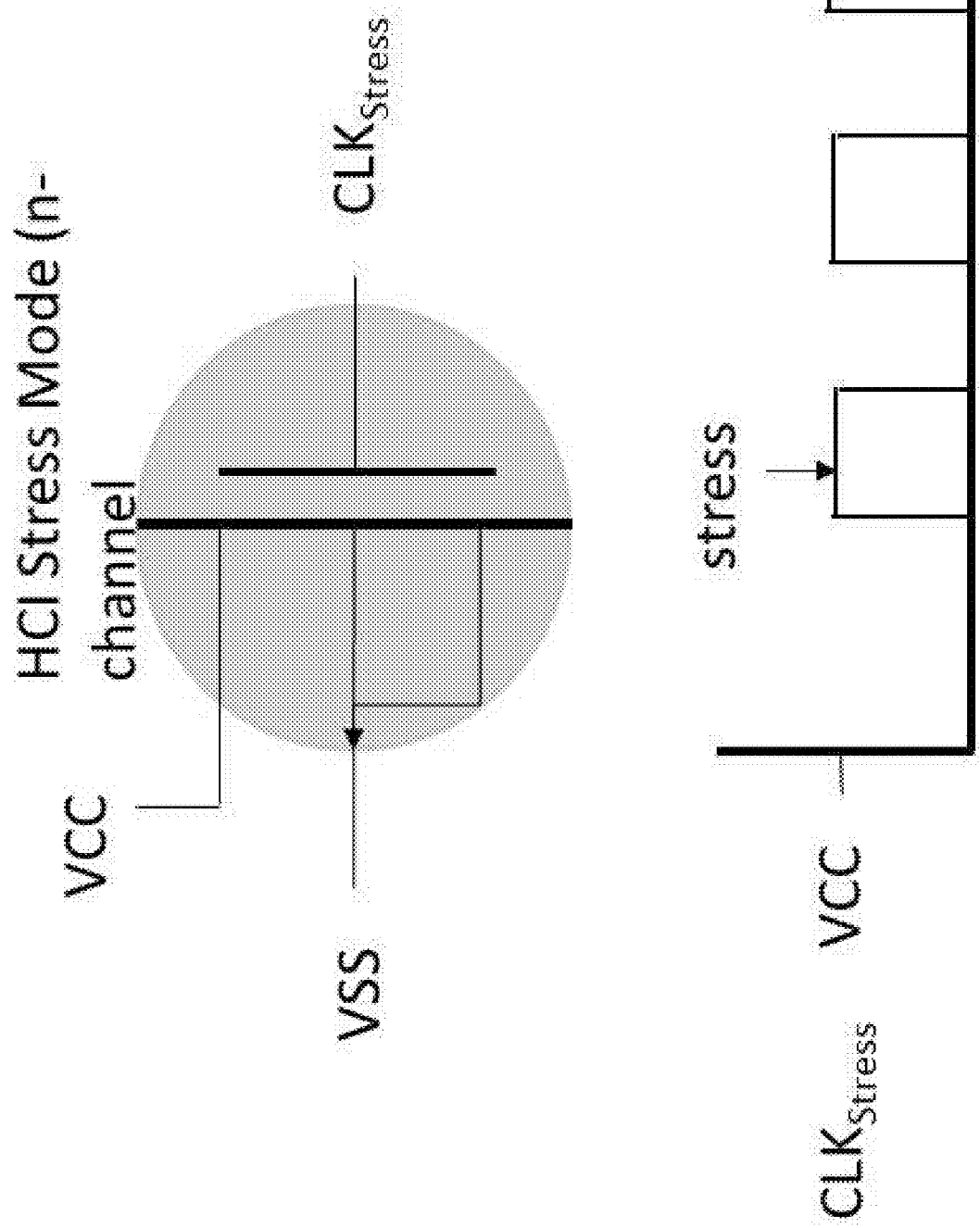
FIG. 5 shows an exemplary block diagram of an n-channel device stressed for HCI.

The hot carrier injection (HCI) sensor (2) consists of two ring oscillators, a reference oscillator, and a stressed oscillator. The stressed oscillator consists gates in which the n-channel devices are stressed as shown in FIG. 5 below. The frequency of the stressed oscillator will vary as compared to the reference (unstressed) oscillator due the HCI effects on the n-channel devices. FIG. 5 shows an exemplary block diagram of an n-channel device stressed for HCI.

Figure 6:
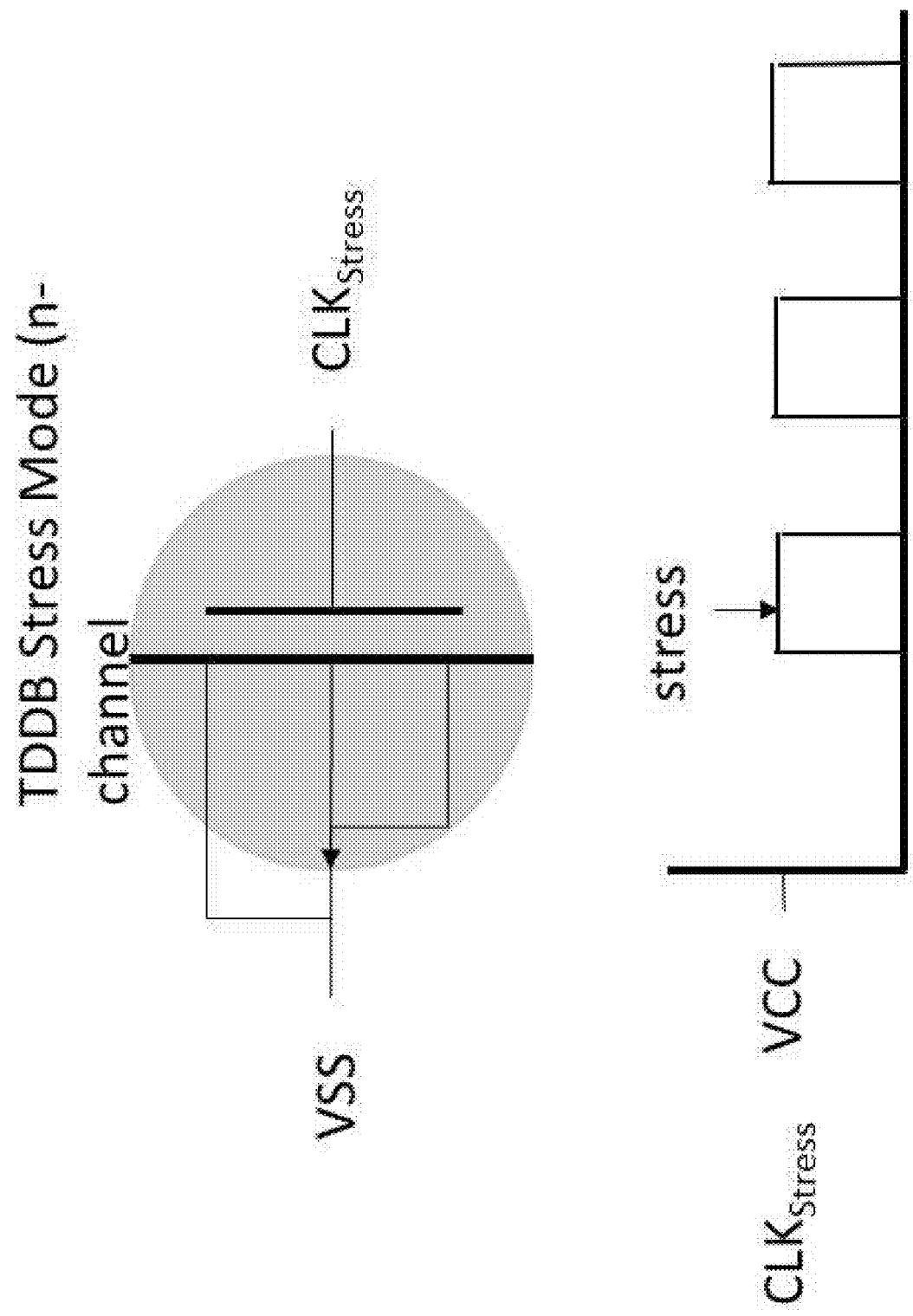
FIG. 6 shows an exemplary block diagram of a n-channel FET stressed for TDDB.

The TDDB sensor (3) consists of FET transistors stressed as shown in FIG. 6. The TDDB sensor will show a change of transistor behavior when the oxide breaks down from aging. When this occurs, there is a significant gate current flowing to the source/drain junctions of the device. FIG. 6 shows an exemplary block diagram of a n-channel FET stressed for TDDB.

The Reliability Sensor (39) is instantiated on a product die using standard design methods and tools. The reliability effects are measured as a part of wafer probe and final test to establish base line measurements at the beginning of the functional life of aa product. At wafer probe, the OTP is programmed to provide a unique identification number of the die based on the wafer ID and also the (x, y) location on the wafer. The reliability measurements are included with the wafer probe and final test measurements thereby enabling a unified data base which includes wafer parametric test data, functional test data, and reliability measurement data for the devices. Since there is a unique identifier for the die, given as the die location on the wafer, and the wafer, enables semiconductor test data mining tools (for example, Galaxy Semiconductor, JMP, Optimal+, etc.) to support analyses of devices and evaluate failures that are confirmed from test or from the field. Since the failed devices include reliability data, machine learning algorithms can then be trained on the data set to assess other devices may be at or nearing failure due to device aging. The inclusion of the reliability sensors with the test bus and internal device bus such as an AMBA bus, the reliability parameters can be tested at wafer probe, final test, or at any time that the test bus on the SoC can be enabled. The reliability sensors are under the control of a set of registers in the JTAG test interface which will select a reliability structure to be measured.

Integration of the Reliability Sensors is detailed next. The Reliability Sensors comprise two elements to be integrated with the SoC. First, there is the gdsii which comprises the following:
  Reliability sensors
  Integrated JTAG interface and on-chip bus interface and associated multiplexing hardware.
  E-fuse or OTP memory and programming hardware for the memory.
  Self-contained memory that stores the reliability measurements until the measurement data can be accessed through the JTAG interface or the on-chip bus interface.

Also, there is an RTL component of the digital portion that primarily consists of:
  JTAG control for the Reliability Sensor.
  On-chip bus interface The Reliability Sensor is integrated into the SoC using the standard design tools for chip development as shown in FIG. 7.

Figure 7:
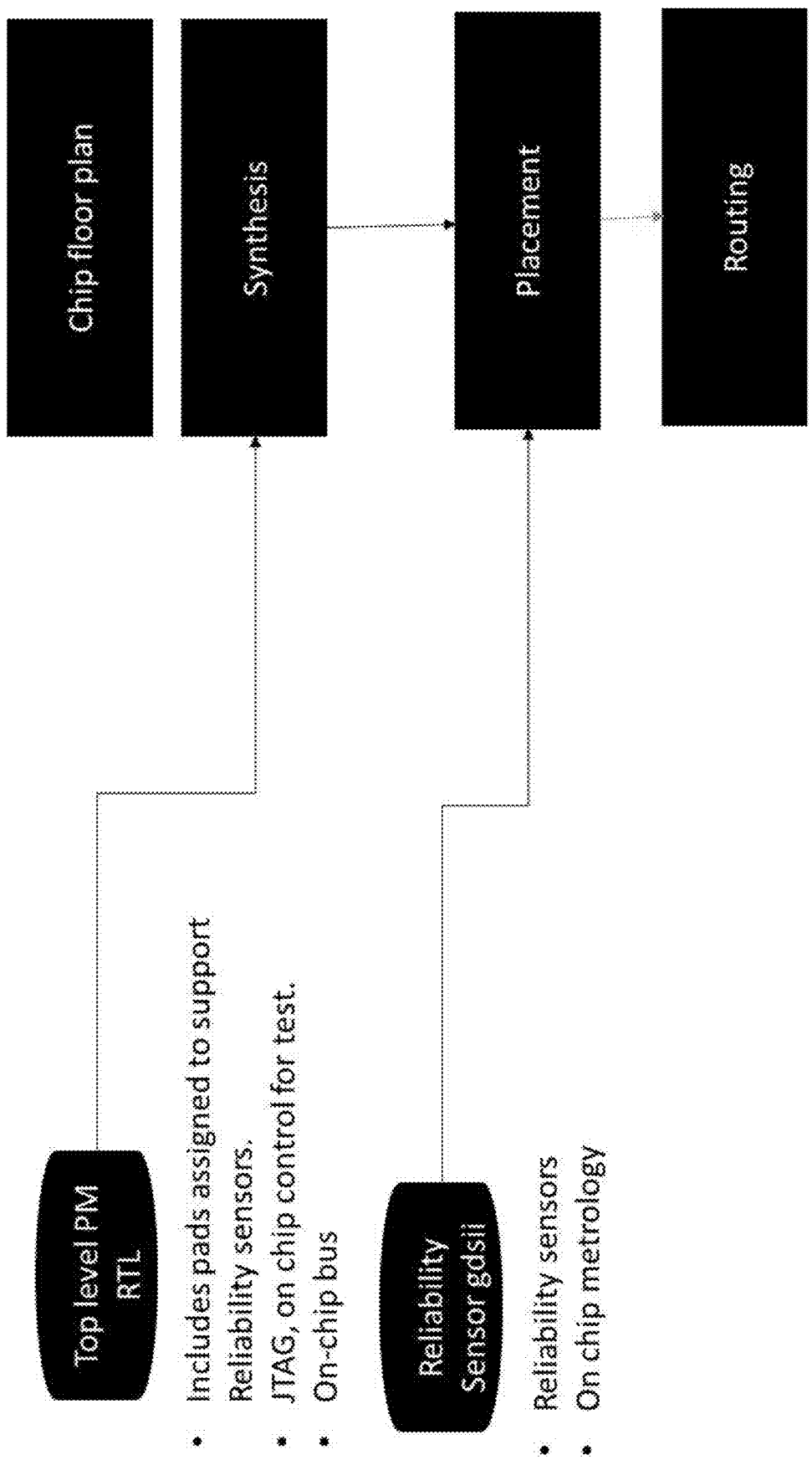
FIG. 7 shows an exemplary process to integrate the Reliability Sensors with a system on a chip (SOC).

FIG. 7 shows an exemplary process to integrate the reliability sensors with a system on a chip (SOC). The reliability sensors are integrated into the SoC using the standard design tools for chip development as shown in FIG. 7 which shows an exemplary Design Flow for integration of the Reliability Sensor onto the SoC. The top level register transfer language (RTL) includes pads assigned to reliability sensors and JTAG on chip control for testing. The system can perform the following:
  Integration of hardware to stress the Reliability Sensors.
  Integration of the Reliability Sensors using standard design tools and methodologies.
  Measurement of the Reliability Sensor using standard production test ATE equipment.
  Integration of the measurement of the Reliability Sensor data with standard production test functional and parametric data into standard data base formats resulting in an "Enterprise Database."
  Addition of reliability measurements captured during device operation into the Enterprise Database.
  Integrating failed device reliability measurements into the Enterprise Database.
  Application of machine learning on the Enterprise Database to predict devices that may fail in the future.

One embodiment runs Test Data analysis and applies machine learning to improve device quality. The system runs the analyses that are enabled given that the process data, test data, and reliability measurements on a per-part basis is now available. The Enterprise Database links together process data, functional test results, and reliability measurements to facilitate the application of machine learning to track semiconductor product performance over the life of the product, and the ability to predict failures based on the observation of field failures.

Figure 8:
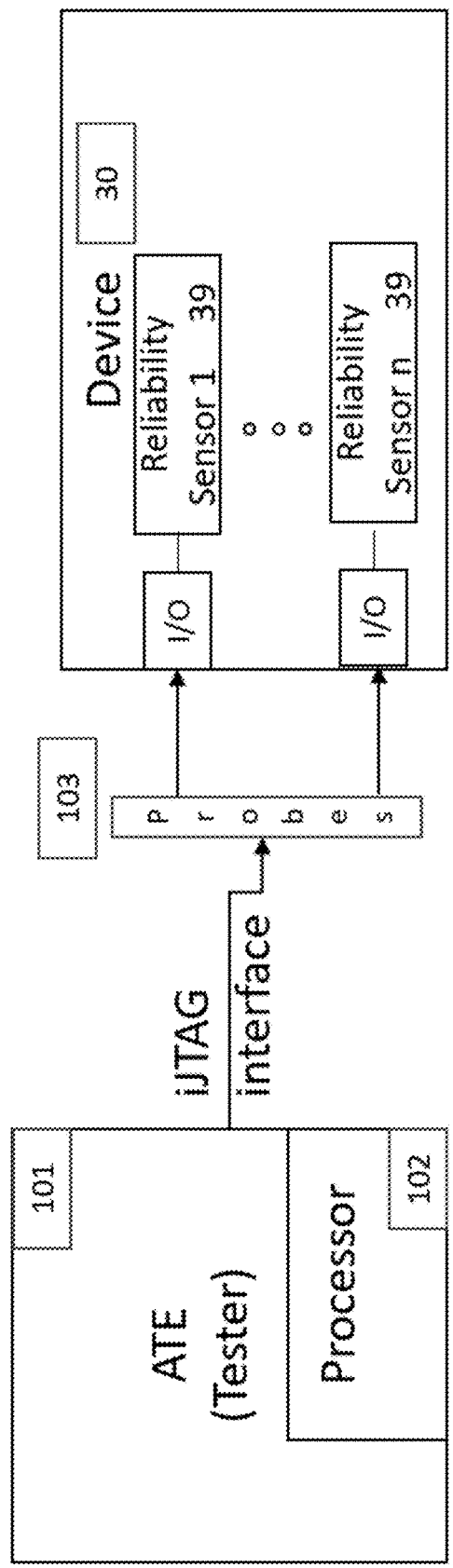
FIG. 8 shows an exemplary automatic test equipment (ATE) system.

FIG. 8 shows the connection of the ATE (101) which includes a processor (102) connected to the Device (30). The connection between ATE and the device is accomplished by an iJTAG test interface though probes (103) that provides the electrical connection to the device through the IO Pads on the device. The device (30) includes the reliability sensor (39) as shown in FIG. 1.

When a device is returned from the field as a failure, and is confirmed as a failure, the device can be tested on the ATE and the measurements of the reliability sensor as well as the final test parameters can be obtained. If the failure is due directly to a device failure, the reliability sensor data provides information as to change in transistor behavior that led to the device failing. This information enables the machine learning models to be adjusted based on new device failure information. As the complete history of the device testing is available, changes in process variation and changes in the functional test results can be seen based on the device aging in the system. The devices that were produced can have their production test data searched and also based on the device wafer location, devices with similar process parameters can be checked to see if there is a pattern that would identify other devices that may be suspect to fail.

One or more test patterns or intermediate results produced by any of the disclosed methods, apparatus, and systems can also be stored on one or more computer-readable media as part of the instant methods and techniques and are considered to be within the scope of this disclosure. Computer-readable media storing such test patterns or intermediate results may be accessed and used by a single computer, networked computer (such as those described above), or dedicated testing system (for example, a tester or automatic testing equipment (ATE).

Test Data analysis and the application of machine learning can be used to improve device quality. Another aspect of the invention involves the analyses that are enabled given that the reliability and test data on a per-part basis is now available using the sensors of FIG. 1. A common data base that links together process data and functional test results facilitate the application of machine learning to address yield issues related to process variation, ability to track to semiconductor product performance over the life of the product, and the ability to predict failures based on the observation of field failures.

In an example for predicting bad parts, when a device is returned from the field as a failure, and is confirmed as a failure, the device can be tested on the ATE and the output of the reliability parameters as well as the final test parameters can be obtained. If the failure is due directly to a device failure as opposed to a system issue that caused the device to fail, the Reliability Sensor provides for the reliability sensors data to be checked and measured. As the complete test and reliability measurement history of all the devices available, changes in reliability measurements and changes in the functional test results can be seen based on the device aging in the system. The devices that were produced can have their production test data searched and also based on the device wafer location, devices with similar process parameters can be checked to see if there is a pattern that would identify other devices that may be suspect to fail.

The foregoing teachings are representative embodiments of methods, apparatus, and systems for quantifying semiconductor fabrication fault diagnosis that should not be construed as limiting in any way. Instead, the present disclosure is directed toward all novel and nonobvious features and aspects of the various disclosed methods, apparatus, and systems, alone and in various combinations and subcombinations with one another. The disclosed technology is not limited to any specific aspect or feature, or combination thereof, nor do the disclosed methods, apparatus, and systems require that any one or more specific advantages be present, or problems be solved.

Any of the methods, apparatus, and systems described herein can be used in conjunction with a wide variety of scan-based or partially-scan-based circuits and in connection with a wide variety of diagnostic procedures. Further, the fault types identified using test sets generated according to the disclosed techniques need not be of a particular type, but can vary from implementation to implementation (e.g., stuck-at faults, transition faults, hold-time faults, and other faults). For illustrative purposes only, however, many of the examples described herein are explained in the context of generating test sets for detecting stuck-at and timing faults (such as transition faults).

Although the operations of some of the disclosed methods are described in a particular, sequential order for convenient presentation, it should be understood that this manner of description encompasses rearrangement, unless a particular ordering is required by specific language set forth below. For example, operations described sequentially may be rearranged or performed concurrently. Moreover, for the sake of simplicity, the figures may not show the various ways in which the disclosed methods, apparatus, and systems can be used in conjunction with other methods, apparatus, and systems. Additionally, the description sometimes uses terms like "determine," "identify," and "constrain" to describe the disclosed technology. These terms are high-level abstractions of the actual operations that are performed. The actual operations that correspond to these terms may vary depending on the particular implementation and are readily discernible by one of ordinary skill in the art.

As used in this application and in the claims, the singular forms "a," "an" and "the" include the plural forms unless the context clearly dictates otherwise. Additionally, the term "includes" means "comprises." Moreover, unless the context dictates otherwise, the term "coupled" means electrically or electromagnetically connected or linked and includes both direct connections or direct links and indirect connections or indirect links through one or more intermediate elements not altering the intended operation of the circuit.

The disclosed embodiments can be implemented in a wide variety of environments. For example, any of the disclosed techniques can be implemented in software comprising computer-executable instructions stored on computer-readable media (e.g., one or more CDs, volatile memory components (such as DRAM or SRAM), or nonvolatile memory components (such as hard drives)). Such software may comprise, for example, electronic design automation ("EDA") software (e.g., an automatic test pattern generation ("ATPG") tool) used to generate test patterns for testing one or more circuits (e.g., an application specific integrated circuit ("ASIC"), a programmable logic device ("PLD") such as a field-programmable gate array ("FPGA"), or a system-on-a-chip ("SoC") having digital, analog, or mixed-signal components thereon). Such software may also comprise, for example, EDA software used to diagnose test responses to chain diagnosis test patterns applied to the one or more circuits. These particular software implementations should not be construed as limiting in any way, however, as the principles disclosed herein are generally applicable to other software tools.

Such software can be executed on a single computer or on a networked computer (e.g., via the Internet, a wide-area network, a local-area network, a client-server network, or other such network). For clarity, only certain selected aspects of the software-based implementations are described. Other details that are well known in the art are omitted. For example, it should be understood that the disclosed technology is not limited to any specific computer language, program, or computer. For the same reason, computer hardware is not described in further detail. For example, the disclosed embodiments can be implemented using a wide variety of commercially available computer systems and/or testing systems. Any of the disclosed methods can alternatively be implemented (partially or completely) in hardware (e.g., an ASIC, PLD, or SoC).

Further, test patterns or diagnostic results (including any intermediate or partial test patterns or diagnostic results) produced from any of the disclosed methods can be created, updated, or stored on computer-readable media (e.g., one or more CDs, volatile memory components (such as DRAM or SRAM), or nonvolatile memory components (such as hard drives)) using a variety of different data structures or formats. Such test patterns and/or diagnostic results can be created or updated at a local computer or over a network (e.g., by a server computer).

The one or more integrated circuits being tested may additionally comprise specialized hardware components used to implement the testing (e.g., compression hardware). Such integrated circuits can be used in a vast assortment of electronic devices, ranging from portable electronics (such as cell phones, media players, and the like) to larger-scale items (such as computers, control systems, airplanes, automobiles, and the like). All such items comprising integrated circuits tested with embodiments of the disclosed technology or equivalents are considered to be within the scope of this disclosure.

Moreover, any of the disclosed methods can be used in a computer simulation, ATPG, or other EDA environment, wherein test patterns, test responses, and compressed test responses are determined by or otherwise analyzed using representations of circuits, which are stored on one or more computer-readable media. For presentation purposes, however, the present disclosure sometimes refers to a circuit or its components by their physical counterpart (e.g., scan cells, primary outputs, paths, circuits, and other such terms). It should be understood, however, that any reference in the disclosure or the claims to a physical component includes representations of such circuit components as are used in simulation, ATPG, or other such EDA environments.

Having illustrated and described the principles of the disclosed technology, it will be apparent to those skilled in the art that the disclosed embodiments can be modified in arrangement and detail without departing from such principles. In view of the many possible embodiments, it will be recognized that the illustrated embodiments include only examples and should not be taken as a limitation on the scope of the disclosed technology. Rather, the scope of the disclosed technology for purposes of this application is defined by the following claims and their equivalents. We therefore claim as our invention all that comes within the scope and spirit of these claims and their equivalents.

What is claimed:

1. A circuit, comprising:
   one or more sensors formed on one or more dies, each sensor detecting one or more wafer characterization data during wafer manufacturing;
   a stress generator on the die to control the one or more sensors to place the one or more sensors under stress during wafer manufacturing or operation; and
   an interface coupled to the one or more sensors to communicate data captured during device operation on chip via the interface for reliability and yield analysis based on device manufacturing data and operation data.

2. The circuit of claim 1, herein the sensor comprises active and passive devices including transistors, resistor, capacitor device structures that characterize reliability of a manufactured semiconductor device.

3. The circuit of claim 1, further comprising a Negative Bias Temperature Instability (NBTI) sensor.

4. The circuit of claim 1, wherein in a stress mode, gates in a ring oscillator formed on the die are stressed with a voltage applied to a substrate and source of p-channel devices of said ring oscillator, and wherein the ring oscillator receives a time varying clock on a p channel gate.

5. The circuit in claim 1, wherein the sensor is aged or have its aging accelerated by voltage and clocks applied to the sensor by the stress generator.

6. The circuit of claim 1, wherein the sensor comprises a reference ring oscillator and a stressed ring oscillator coupled to a phase comparator.

7. The circuit of claim 6, wherein the stressed oscillator is stressed with an overvoltage on its supply lines.

8. The circuit of claim 6, wherein the stressed oscillator in a stress mode has the feedback loop in the oscillator disconnected and a stress signal coupled to a NAND gate to break an oscillator loop.

9. The circuit of claim 1, further comprising a programmable e-fuse block and control for programming the e-fuse which identify a wafer and die location under test.

10. The circuit of claim 1, wherein the die sensor comprises a Hot Carrier Injection (HCI) sensor.

11. The circuit of claim 10, wherein the HCI sensor comprises a reference oscillator and a stressed oscillator.

12. The circuit of claim 11, wherein a frequency of the stressed oscillator is varied relative to the reference oscillator due to HCI effects on the n-channel devices of said stressed oscillator.

13. The circuit of claim 1, further comprising a time dependent dielectric breakdown (TDDB) sensor.

14. The circuit of claim 13, wherein the TDDB sensor has a stressed mode FET transistors.

15. The circuit of claim 13, wherein the TDDB sensor detects a change of transistor behavior due to oxide breakdown from aging with predetermined gate current flowing to source/drain junctions of FET transistors in the TDDB sensor.

16. The circuit of claim 1, wherein the interface is accessed by test hardware and control logic.

17. The circuit of claim 1, wherein the sensors measure reliability and wherein the sensors are connected to an on-chip bus.

18. The circuit of claim 1, wherein the sensors connected to an on-chip bus and accessible during device operation in the field.

19. The circuit of claim 1, comprising an on-chip bus for field sensor data retrieval through the bus.

20. A wafer comprising:
   one or more operating circuits on the wafer to perform predetermined operations after wafer fabrication; and
   one or more stress test circuits operational only during wafer fabrication, each including:

one or more sensors adapted to be formed on a wafer, each sensor detecting one or more wafer characterization data in a stressed condition;

a stress generator controlling the one or more sensors to place the one or more sensors under stress during wafer manufacturing;

memory coupled to the one or more sensors to store wafer characteristics under the stressed condition; and an interface coupled to the memory to communicate the wafer characterization data during on-chip operation for reliability and yield analysis based on device manufacturing data and operation data.

21. An automated test equipment (ATE) to test a wafer with one or more reliability sensors therein, each including a plurality of active and passive device structures that characterize a semiconductor manufacturing process, input/output (IO) pads adapted to be accessed by test hardware and control logic, memory, and control for programming the memory which identify the wafer and die location at test in an integrated circuit, the wafer having one or more sensors formed on one or more dies, each sensor detecting one or more wafer characterization data in a stressed condition during device operation; a stress generator on the die to control the one or more sensors to place the one or more sensors under stress during wafer manufacturing and operation; memory coupled to the one or more sensors to store wafer characteristics under the stressed condition; and an interface coupled to the memory to communicate the wafer characterization data for reliability and yield analysis based on device manufacturing data and operation data, the ATE comprising:

probes coupleable to the wafer to capture wafer functional data with on chip stress sensor and memory to store failure data; and a processor to receive functional test measurements during or after fabricating one or more functional blocks, wherein the processor predicts device failures based on information of known device failures or related process parameters and their relationship to functional test measurements.

22. The ATE of claim 21, wherein said processor provides traceability throughout a product life cycle including functional parameter measurements and related process parameters.

23. The ATE of claim 21, wherein said processor performs:

measurement of the sensors using the probes;

integration of the measurement of the sensors data with standard production test functional and parametric data into standard data base formats resulting in a database;

reliability measurements captured during device operation;

integrating failed device reliability measurements into the database; and application of machine learning on the database to predict device failure.

24. The ATE of claim 21, wherein the sensors are connected to an on-chip bus.

* * * * *